US008908382B2

(12) United States Patent
Lee et al.

(10) Patent No.: US 8,908,382 B2
(45) Date of Patent: Dec. 9, 2014

(54) CONTROL PANEL FOR MICROWAVE OVEN

(75) Inventors: Byungcheon Lee, Changwon-si (KR); Byounggu Kim, Changwon-si (KR); Modam Joo, Changwon-si (KR); Jaekwan Jung, Changwon-si (KR); Donghan Kim, Changwon-si (KR); Jaeho Lee, Changwon-si (KR); Keunjae Hwang, Changwon-si (KR); Chulwoo Lee, Changwon-si (KR)

(73) Assignee: LG Electronics Inc., Seoul (KR)

( * ) Notice: Subject to any disclaimer, the term of this patent is extended or adjusted under 35 U.S.C. 154(b) by 149 days.

(21) Appl. No.: 13/511,477

(22) PCT Filed: Jan. 21, 2010

(86) PCT No.: PCT/KR2010/000372

§ 371 (c)(1), (2), (4) Date: May 23, 2012

(87) PCT Pub. No.: WO2011/090223

PCT Pub. Date: Jul. 28, 2011

(65) Prior Publication Data

US 2012/0281374 A1 Nov. 8, 2012

(51) Int. Cl.

*H05K 5/00* (2006.01)
*F24C 7/08* (2006.01)
*H05B 6/64* (2006.01)

(52) U.S. Cl.

CPC .............. *F24C 7/082* (2013.01); *H05B 6/6435* (2013.01)
USPC ........... 361/756; 361/801; 361/802; 361/741; 361/752; 361/796; 219/702

(58) Field of Classification Search

CPC ................ H05K 5/006; H05K 7/1451; H05K 2201/10287; H05K 2201/10356; H05K 7/02; H01R 9/00; H01R 12/00
USPC .......... 361/802, 741, 752, 796, 756; 219/702, 219/719, 714, 720, 756, 757
See application file for complete search history.

(56) References Cited

U.S. PATENT DOCUMENTS 4,304,976 A * 12/1981 Gottbreht et al. ............. 219/702
4,336,569 A * 6/1982 Tsuda et al. .................. 361/736

(Continued)

FOREIGN PATENT DOCUMENTS

| | | |
|---|---|---|
| KR | 20-2000-0011345 | 7/2000 |
| KR | 10-2003-0074005 | 9/2003 |
| KR | 20-0371498 | 12/2004 |
| KR | 10-2005-0100180 | 10/2005 |

OTHER PUBLICATIONS

International Search Report issued in PCT Application No. PCT/KR2010/000372 dated Sep. 29, 2010.

*Primary Examiner* — Lisa Lea Edmonds
*Assistant Examiner* — Keith Depew
(74) *Attorney, Agent, or Firm* — Ked & Associates, LLP

(57) ABSTRACT

Provided is a control panel for a microwave oven, which includes a control casing, at least one board in the control casing, and at least two board holders. Each of the board holders includes a board insertion slot and a foolproof rib. The board insertion slots receive both ends of the board. The foolproof ribs catch a portion of the board to prevent the board from being improperly inserted into the board insertion slot. Accordingly, the control panel can be assembled more accurately, and operates more reliably.

13 Claims, 10 Drawing Sheets

(56) References Cited

U.S. PATENT DOCUMENTS

| | | | | |
|---|---|---|---|---|
| 4,977,532 | A * | 12/1990 | Borkowicz et al. | 361/741 |
| 6,054,699 | A * | 4/2000 | Kim et al. | 219/756 |
| 6,418,035 | B1 * | 7/2002 | Yu | 361/809 |
| 6,497,580 | B2 * | 12/2002 | Watanabe et al. | 439/65 |
| 6,498,731 | B1 * | 12/2002 | Roscoe et al. | 361/796 |
| 6,881,935 | B2 * | 4/2005 | Kim et al. | 219/702 |
| 7,026,589 | B2 * | 4/2006 | Kim | 219/702 |
| 7,368,693 | B2 * | 5/2008 | Maeda | 219/720 |
| 7,443,695 | B2 * | 10/2008 | Roscoe et al. | 361/802 |
| 8,299,410 | B2 * | 10/2012 | Hirano et al. | 219/757 |
| 2012/0218709 | A1 * | 8/2012 | Tian et al. | 361/695 |

* cited by examiner

CONTROL PANEL FOR MICROWAVE OVEN

BACKGROUND

The present disclosure relates to a microwave oven, and more particularly, to a contol panel for a microwave oven.

Microwave ovens are cooking appliances that use microwaves to heat and cook food. Such a microwave oven is provided with a control panel that is used to input a signal for cooking food, and output cooking information of food.

SUMMARY

Embodiments provide a control panel for a microwave oven, which can be more accurately assembled.

Embodiments also provide a control panel for a microwave oven, which provides improved operation reliability.

In one embodiment, a control panel for a microwave oven includes: a control casing; at least one board in the control casing; and at least two board holders each including a board insertion slot and a foolproof rib, wherein the board insertion slots receive both ends of the board, and the foolproof ribs catch a portion of the board to prevent the board from being improperly inserted into the board insertion slot.

In another embodiment, a control panel for a microwave oven includes: a control casing having a polyhedron shape that is open in at least one portion of a rear surface; at least one board in the control casing; a vent hole disposed in a top surface of the control casing or one of both side surfaces of the control casing, air passing through the vent hole; a partition rib partitioning an inner space of the control casing into a space accommodating the board and a space in which the air passing through the vent hole flows; and a movement preventing rib for preventing a movement of a foreign substance introduced through the vent hole into the space in which the air flows.

In another embodiment, a control panel for a microwave oven includes: a control casing; a plurality of boards provided to the control casing; a wire connecting the boards to each other; and a wire arranging holder around which the wire is wound.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
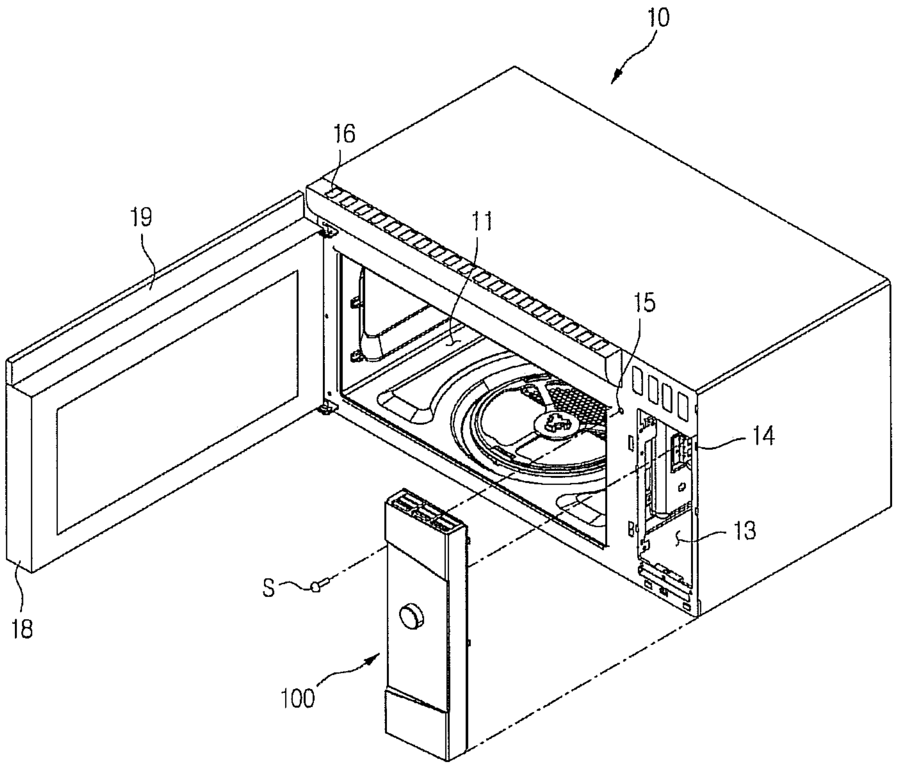
FIG. 1 is an exploded perspective view illustrating a microwave oven including a control panel according to an embodiment.
Figure 2:
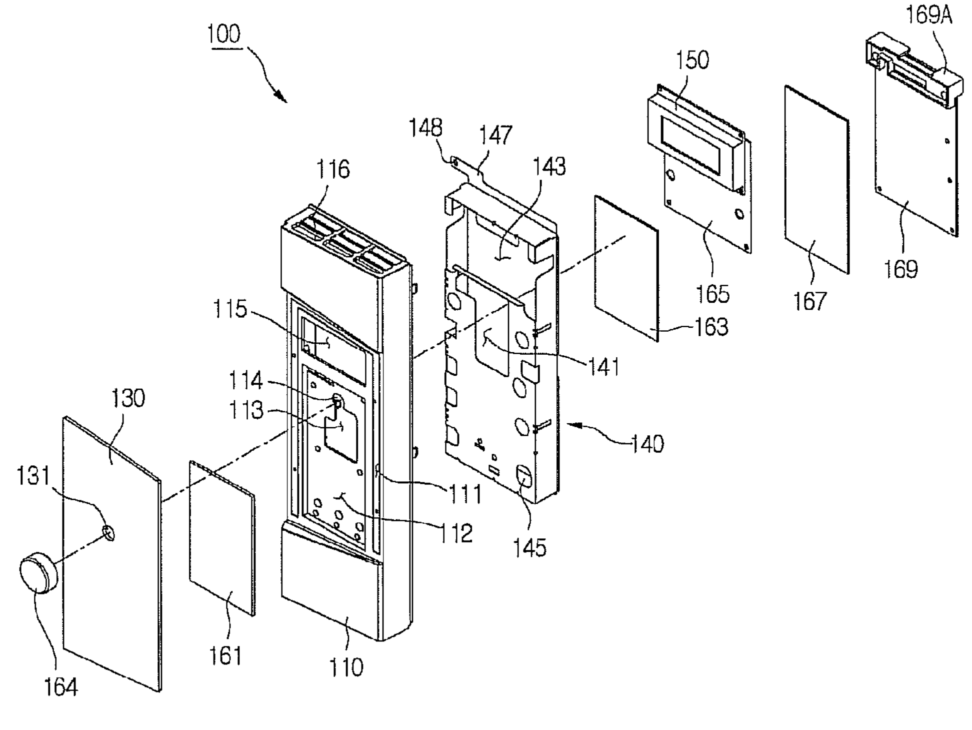
FIG. 2 is an exploded perspective view illustrating the control panel of FIG. 1.
Figure 3:
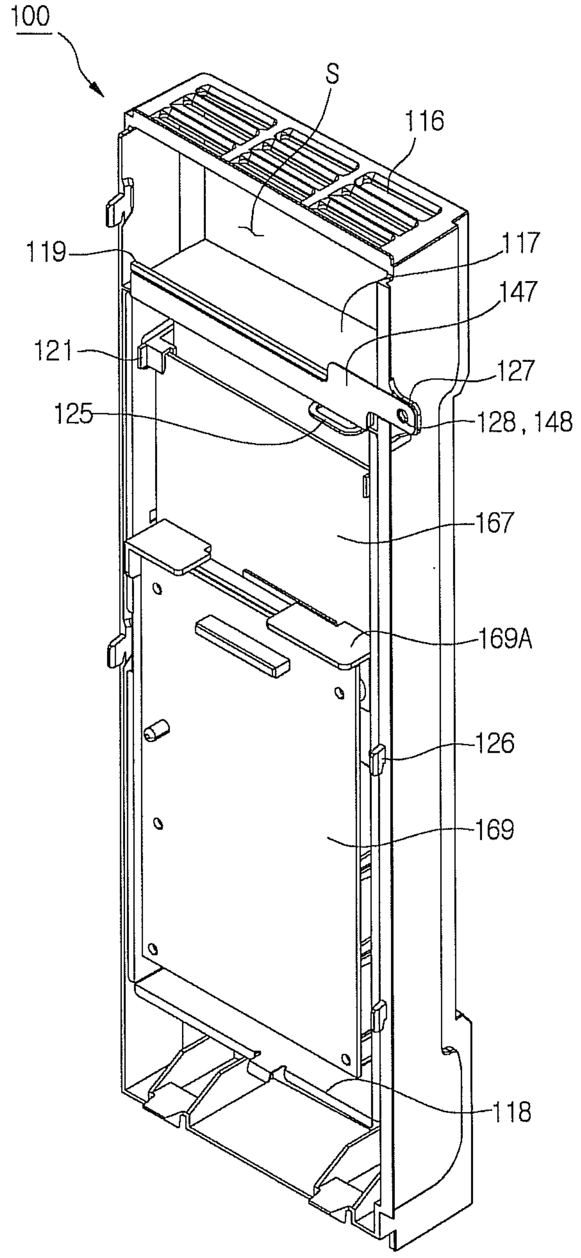
FIG. 3 is a perspective view illustrating an inner portion of the control panel of FIG. 1.
Figure 4:
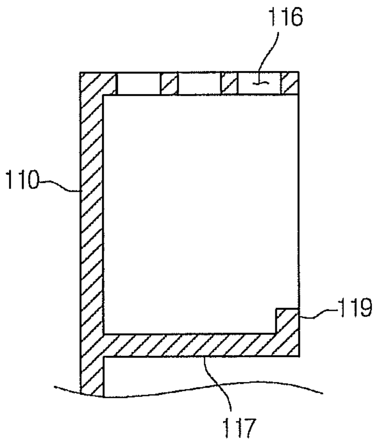
FIG. 4 is a vertical cross-sectional view illustrating a principal part of the control panel of FIG. 1.
Figure 5:
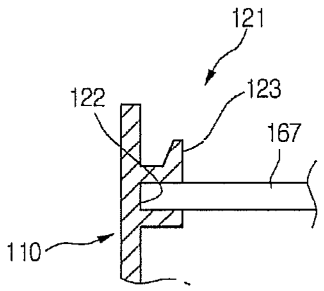
FIG. 5 is a horizontal cross-sectional view illustrating a board inserted in a board holder of the control panel of FIG. 1.
Figure 6:
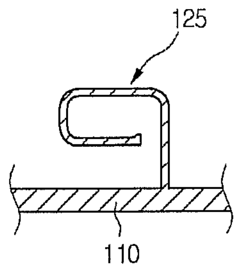
FIG. 6 is a horizontal cross-sectional view illustrating a wire arranging holder of the control panel of FIG. 1.

FIG. 1 is an exploded perspective view illustrating a microwave oven including a control panel according to an embodiment. FIG. 2 is an exploded perspective view illustrating the control panel of FIG. 1. FIG. 3 is a perspective view illustrating an inner portion of the control panel of FIG. 1. FIG. 4 is a vertical cross-sectional view illustrating a principal part of the control panel of FIG. 1. FIG. 5 is a horizontal cross-sectional view illustrating a board inserted in a board holder of the control panel of FIG. 1. FIG. 6 is a horizontal cross-sectional view illustrating a wire arranging holder of the control panel of FIG. 1.

Referring to FIG. 1, a cooking compartment 11 and an electric compartment 13 are disposed in a main body 10 of a microwave oven. Food is cooked in the cooking compartment 11, and a plurality of electric parts (not shown) and a cooling fan (not shown) for cooling the electric parts are disposed in the electric compartment 13. Each of the cooking compartment 11 and the electric compartment 13 may have a polyhedron shape with an open front surface.

A plurality of hook insertion slots 14 and a coupling hole 15 are disposed in the front surface of the main body 10. A coupling member S and coupling hooks 126 to be described later are inserted in the coupling hole 15 and the hook insertion slots 14, so as to fix a control panel 100 to be described later.

A vent grill 16 is disposed at the front side of the main body 10 over the cooking compartment 11. Air introduced in and discharged out of the main body 10 flows through the vent grill 16. For example, air including a contaminant, which is introduced from a cooking appliance (not shown) disposed under the main body 10 into the main body 10 while cooking food, may be discharged to an indoor space through the vent grill 16. Also, air including a contaminant, which is generated in the cooking compartment 11 while cooking food, may be discharged to the indoor space through the vent grill 16.

The main body 10 is provided with a door 18. The door 18 selectively opens and closes the cooking compartment 11. For example, the door 18 may be a side-swing type door in which an end is rotated about another end attached to the main body 10, to open and close the main body 10. The upper front end of the door 18 is provided with a shielding part 19. The shielding part 19 shields the vent grill 16 while the door 18 closes the cooking compartment 11.

The front surface of the main body 10 is provided with the control panel 100. The control panel 100 receives a signal for operating the microwave oven, and outputs information about an operation of the microwave oven. In detail, the control panel 100 receives a signal for cooking food in the cooking compartment 11, and outputs information about the cooking of the food in the cooking compartment 11. Referring to FIGS. 2 and 3, the control panel 100 includes a control casing 110, a control glass 130, a control bracket 140, a display 150, and a plurality of boards.

In detail, the control casing 110 has an approximately polyhedron shape having an open front surface, for example, a hexahedron shape. For example, the control casing 110 may be formed of a synthetic resin through molding.

The front surface of the control casing 110 is provided with a glass seating part 111 and a touch board seating part 112. The glass seating part 111 is formed by recessing a portion of the front surface of the control casing 110 from the other portion thereof. The touch board seating part 112 is formed by recessing a portion of the front surface of the glass seating part 111 from the other portion thereof.

The control casing 110 is provided with a wire through opening 113 and a rod through opening 114. A wire (not shown), which connects a touch board 161 to a main board 167 to be described later, passes through the wire through opening 113. A rotation rod (not shown) to be described later passes through the rod through opening 114.

The control casing 110 is provided with a display window 115. The display window 115 is formed by cutting a portion of the front surface of the control casing 110, particularly, a portion of the glass seating part 111 over the wire through opening 113 and the rod through opening 114.

The top surface of the control casing 110 is provided with vent holes 116. Air for cooling the electric parts in the electric compartment 13 is introduced through the vent holes 116. That is, when the cooling fan is driven in the electric compartment 13, the electric parts are cooled by air flowing into the electric compartment 13 through the vent holes 116.

A first partition rib 117 and a second partition rib 118 are disposed in the control casing 110. The first partition rib 117 and the second partition rib 118 are vertically spaced a predetermined distance from each other in the control casing 110. Air introduced through the vent holes 116 flows in the control casing 110 over the first partition rib 117. The boards are disposed in the control casing 110 between the first partition rib 117 and the second partition rib 118.

A movement preventing rib 119 for preventing a movement of a foreign substance is disposed at the rear end of the first partition rib 117. Referring to FIG. 4, the movement preventing rib 119 extends upward from the rear end of the first partition rib 117. The movement preventing rib 119 prevents a foreign substance passing through the vent holes 116 in a space S from being introduced into a space which accommodates the board.

Both inner sides of the control casing 110 are provided with at least two board holders 121. The board holders 121 fix the main board 167. The board holders 121 are disposed at heights corresponding to each other on the inner sides of the control casing 110.

Referring to FIG. 5, the board holders 121 are provided with board insertion slots 122. Both side ends of the main board 167 are inserted in the board insertion slots 122. In the current embodiment, the board insertion slots 122 have openings facing each other and directed downward. Thus, the board insertion slots 122 receive both the side ends of the main board 167 sliding upward.

The board holders 121 are provided with foolproof protrusions 123. The foolproof protrusions 123 protrude rearward from the rear surfaces of the board holders 121. The foolproof protrusions 123 prevents the main board 167 from being improperly fixed to the board holders 121, that is, prevents both the side ends of the main board 167 from being improperly inserted into the board insertion slots 122. That is, for example, when the main board 167 is obliquely slid, one of the side ends of the main board 167 may be inserted in one of the board insertion slots 122, and the other side end thereof may be disposed out of the other of the board insertion slots 122. In this case, the foolproof protrusion 123 catches a portion of the main board 167 to prevent the main board 167 from being improperly inserted into the board insertion slots 122.

Referring again to FIG. 3, a wire arranging holder 125 is disposed in the control casing 110 near the bottom surface of the first partition rib 117. The wire arranging holder 125 is used to arrange wires connecting the touch board 161 to the main board 167. Referring to FIG. 6, in the current embodiment, the wire arranging holder 125 may have an end connected to the control casing 110, and the other end bent to form a predetermined open curve.

Referring to FIG. 3, both side portions of the control casing 110 are provided with the coupling hooks 126. The coupling hooks 126 extend rearward from the rear ends of both the side portions of the control casing 110. The coupling hooks 126 are inserted in the hook insertion slots 14, respectively.

A side surface of the control casing 110 is provided with an extension rib 127. For example, the extension rib 127 may extend from an end of the movement preventing rib 119 to the outside of the control casing 110. The extension rib 127 is provided with a first through hole 128. The coupling member S coupled to the coupling hole 15 passes through the first through hole 128.

Although not shown, the control casing 110 is provided with fixing bosses and guide bosses. The fixing bosses are coupled to coupling members (not shown) for fixing the board, and the guide bosses are used to guide the position of the board.

Referring to FIG. 2, the control glass 130 is fixed to the front surface of the control casing 110. In detail, the control glass 130 may be seated on the glass seating part 111, and be attached thereto, for example, by an adhesive and/or a double-sided adhesive tape. The control glass 130 is provided with a rod through hole 131. A rod passes through the rod through hole 131.

The control bracket 140 is disposed in the control casing 110. The control bracket 140 has a polyhedron shape with an open rear surface corresponding to the control casing 110. The control bracket 140 is formed of a metal, and is grounded to the main body 10.

The control bracket 140 is provided with a through opening 141, a display through opening 143, and a plurality of boss through holes 145. The through opening 141 is formed by cutting a portion of the front surface of the control bracket 140 to correspond to the wire through opening 113 and the rod through opening 114. The display through opening 143 is formed by cutting a portion of the front surface of the control bracket 140 to correspond to the display window 115. The fixing bosses and the guide bosses pass through the boss through holes 145. The control bracket 140 is provided with a ground rib 147. The ground rib 147 extends outward from a side portion of the control bracket 140. When the control panel 100 is fixed to the main body 10, the ground rib 147 contacts the front surface of the main body 10 to substantially function as a ground. In the current embodiment, the ground rib 147 overlaps the extension rib 127 in the back-and-forth direction thereof. The ground rib 147 is provided with a second through hole 148 corresponding to the first through hole 128. Thus, the coupling member S is coupled to the coupling hole 15 substantially through the first and second through holes 128 and 148.

Referring again to FIG. 2, the display 150 displays information about an operation of the microwave oven to the outside thereof. The display 150 is disposed on the front surface of a display board 165 to be described later. The display 150 sequentially passes through the display through opening 143 and the display window 115, and is exposed to the outside. The display 150 is substantially covered and protected by the control glass 130.

The above-described boards include the touch board 161, an encoder board 163, the display board 165, the main board 167, and a relay board 169. The boards are provided with the display 150, an encoder, and an electric device such as a button or switch receiving a signal for operating the microwave oven.

In detail, the touch board 161 is seated on the touch board seating part 112. Thus, the touch board 161 is substantially disposed between the front surface of the control casing 110 and the rear surface of the control glass 130. The touch board 161 is provided with touch buttons (not shown) that are capacitive-type or resistive-type buttons to receive a signal through the control glass 130. The touch board 161 is connected to the main board 167 through a wire passing through the wire through hole 113 and the through opening 141.

The encoder board 163 is disposed in the control bracket 140. The front surface of the encoder board 163 is provided with the encoder. The rod provided to the encoder passes through the through opening 141, the rod through opening 114, and the rod through hole 131, and is exposed to the front side of the control glass 130. The front end of the rod is coupled to a dial knob 164. The encoder board 163 is connected to the main board 167 through a wire (not shown).

The display board 165 is disposed in the control bracket 140. The front surface of the display board 165 is provided with the display 150. The display board 165 is connected to the main board 167 through a wire (not shown).

The main board 167 is disposed in the control bracket 140 behind the encoder board 163 and the display board 165. Both the side ends of the main board 167 are substantially inserted in the board holders 121, that is, in the board insertion slots 122. The main board 167 is connected to the touch board 161, the encoder board 163, and the display board 165 through the wires.

The relay board 169 is disposed in the control bracket 140 behind the main board 167. The front surface of the relay board 169 is provided with a pin connection part 169A. The relay board 169 is connected to the main board 167 through the pin connection part 169A using a pin-to-pin method.

The wires connecting the touch board 161, the encoder board 163, and the display board 165 to the main board 167 are wound around the wire arranging holder 125, and thus, are arranged. Particularly, the wire connecting the touch board 161 or the encoder board 163 to the main board 167 may be wound in advance around the wire arranging holder 125, so that the wire can be connected to the main board 167 without interfering with the display board 165.

An operation of a control panel according to an embodiment will now be described with reference to the accompanying drawings.

First, a process of preventing a foreign substance from being introduced into the control panel will now be described.

Figure 7:
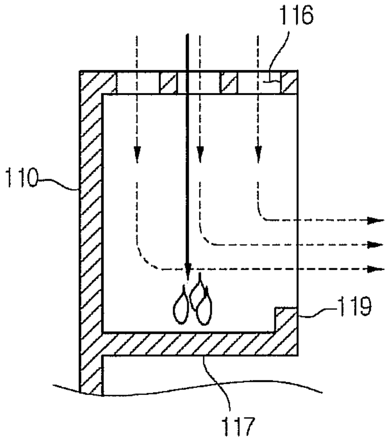
FIGS. 7 and 8 are vertical cross-sectional views illustrating a process in which a foreign substance is introduced into a control panel of a microwave oven through vent holes, according to an embodiment.
Figure 8:
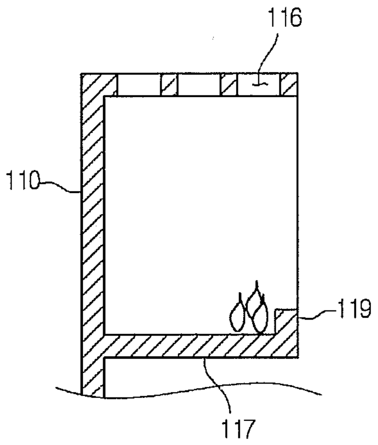

FIGS. 7 and 8 are vertical cross-sectional views illustrating a process in which a foreign substance is introduced into a control panel of a microwave oven through vent holes, according to an embodiment.

Referring to FIG. 7, when the cooling fan (not shown) is driven in the electric compartment 13 (refer to FIG. 1), air (depicted with dotted arrows) is introduced into the electric compartment 13 through the vent holes 116. As such, air introduced into the electric compartment 13 cools electric parts (not shown) in the electric compartment 13.

A foreign substance (depicted with a solid arrow) as well as air may be introduced through the vent holes 116. As such, a foreign substance introduced through the vent holes 116 is substantially collected on the top surface of the first partition rib 117.

In this state, referring to FIG. 8, the foreign substance collected on the top surface of the first partition rib 117 is prevented from moving into the control panel 100 and/or the electric compartment 13 by the movement preventing rib 119 extending upward from the rear end of the first partition rib 117. Thus, electric parts disposed in the control panel 100 and/or the electric compartment 13 are protected from a foreign substance.

Figure 9:
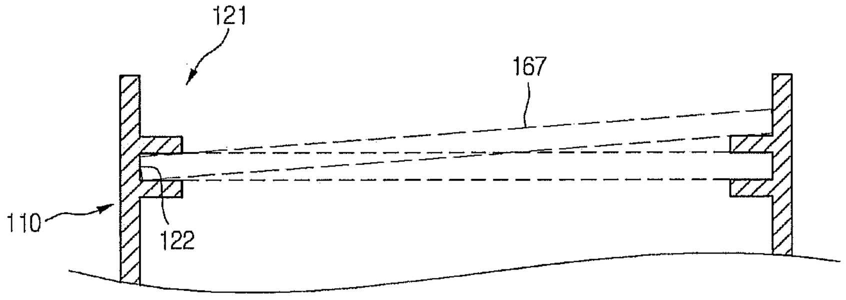
FIGS. 9 and 10 are vertical cross-sectional views illustrating processes of installing a board on a control panel of a microwave oven according to the presence and absence of foolproof protrusions, according to an embodiment.
Figure 10:
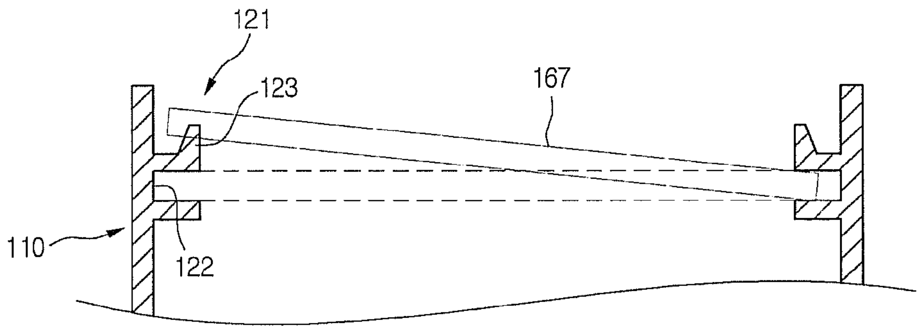

A process of installing a main board will now be described according to an embodiment. FIGS. 9 and 10 are vertical cross-sectional views illustrating processes of installing a board on a control panel of a microwave oven according to the presence and absence of foolproof protrusions, according to an embodiment.

Referring to FIG. 9, when the foolproof protrusions 123 are removed, only one of both the side ends of the main board 167 may be inserted in the board insertion slot 122. However, since the main board 167 has certain elasticity, the main board 167 may be bent, and be improperly inserted in the board insertion slot 122. That is, the left end of the main board 167 with respect to FIG. 9 is inserted in the board insertion slot 122, and the right end of the main board 167 with respect to FIG. 9 may not be inserted in the board insertion slot 122, and be disposed over the board holder 121.

In this case, unless a worker recognizes the improper insertion of the main board 167, the main board 167 may be fixed in a bent state to the board holder 121. Thus, as time is elapsed with the main board 167 in the bent state, the main board 167 and/or various parts mounted on the main board 167 may be damaged.

Referring to FIG. 10, when the foolproof protrusions 123 are provided, improper insertion of the main board 167 is prevented as described above. That is, when one of both the side ends of the main board 167 is positioned out of the board insertion slot 122, the foolproof protrusion 123 catches the side end, so that a worker can easily recognize improper insertion of the main board 167. Accordingly, bending of the main board 167 is prevented. Furthermore, the main board 167 and/or various parts mounted on the main board 167 can be protected. Although the board holders fix the main board according to the above described embodiments, the board holders may fix the main board and/or another board.

In addition, although the foolproof protrusions are provided only to the rear surfaces of the board holders according to the above described embodiments, the foolproof protrusions may provided to the front surfaces of the board holders. Furthermore, the number of the foolproof protrusions may be three or more. In addition, although the wire arranging holder has an open curved shape according to the above described embodiments, the wire arranging holder may have any shape, provided that a wire can be wound around the wire arranging holder.

According to the embodiments, the following effects can be attained.

A foreign substance introduced through the vent holes for introducing air into the electric compartment is prevented from flowing into the electric compartment and/or the control panel by the movement preventing rib. Thus, damage to the microwave oven can be prevented, and operation reliability thereof can be improved.

In addition, according to the embodiments, the board can be accurately inserted and fixed. in the board holders, without improper insertion. Accordingly, damage to the board and/or parts mounted on the board can be prevented.

In addition, according to the embodiments, the wires connecting the boards to one another are wound around the wire arranging holder, and thus, are arranged. Accordingly, the control panel can be more easily assembled, and damage to the wires can be prevented, thereby using the microwave oven more stably.

According to the embodiments, the control panel can be more accurately assembly, and operation reliability thereof is improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A control panel for a microwave oven, comprising:

a control casing provided with at least two board holders;

at least one board, both ends of the board being received in the at least two board holders, wherein each of the two board holders includes a board insertion slot and a rib protruding therefrom to prevent the board from being improperly inserted into the board insertion slot, wherein the rib extends in a direction away from the board insertion slot; and an extension rib that extends from the control casing, the extension rib comprising a through hole through which a coupling member to fix the control casing to a main body of the microwave oven passes.

2. The control panel according to claim 1, wherein the board holders are horizontally disposed at the same height on both inner side surfaces of the control casing having a polyhedron shape with an open rear surface.

3. The control panel according to claim 1, wherein the board holders are integrally formed with the control casing.

4. The control panel according to claim 1, wherein the board insertion slots are open in one of upward and downward directions, and are open in directions facing each other.

5. The control panel according to claim 1, wherein the control casing further comprises:

one or more vent holes;

a partition rib partitioning an inner space of the control casing into a first space accommodating the board and a second space in which air passing through the one or more vent hole flows; and a foreign substance movement preventing rib that prevents movement of a foreign substance introduced through the vent hole in the second space into the first space in which the air flows.

6. The control panel according to claim 5, wherein the foreign substance movement preventing rib extends toward the one or more vent holes from a top surface of the partition rib.

7. The control panel according to claim 5, wherein the partition rib and the foreign substance movement preventing rib are integrally formed with the control casing.

8. The control panel according to claim 1, further comprising a control bracket that is disposed in the control casing, the control bracket comprises a ground rib overlapping the extension rib in a back-and-forth direction to closely contact a front surface of the main body, and is formed of a metal.

9. A control panel for a microwave oven, comprising:

a control casing provided with at least two board holders;

a touch board seated on a front side of the control casing;

a control glass that covers the touch board;

a control bracket provided with a ground rib and being mounted to the control casing; and a main board connected to the touch board, wherein ends of the main board are inserted in the at least two board holders in a state in which the control bracket is mounted to the control casing.

10. The control panel according to claim 9, wherein the control casing is provided with a touch board seating portion on which the touch board is seated.

11. The control panel according to claim 9, further comprising a display board; and a display mounted on a front surface of the display board;

wherein the control casing comprises a window through which the display passes, the control glass covers the display.

12. The control panel according to claim 9, wherein the control casing further comprises one or more vent holes.

13. A control panel for a microwave oven, comprising:

a control casing provided with at least two board holders;

a control bracket that is connected to the control casing and is formed of a metal material; and at least one board, both ends of the board being received in the at least two board holders in a state in which the control bracket is mounted to the control casing, wherein each of the two board holders includes a board insertion slot and a rib protruding therefrom to prevent the board from being improperly inserted into the board insertion slot, wherein the rib extends in a direction away from the board insertion slot.

* * * * *